US011961739B2

(12) United States Patent
Yang et al.

(10) Patent No.: US 11,961,739 B2
(45) Date of Patent: Apr. 16, 2024

(54) BORON CONCENTRATION TUNABILITY IN BORON-SILICON FILMS

(71) Applicant: Applied Materials, Inc., Santa Clara, CA (US)

(72) Inventors: Yi Yang, San Jose, CA (US); Krishna Nittala, San Jose, CA (US); Rui Cheng, San Jose, CA (US); Karthik Janakiraman, San Jose, CA (US); Diwakar Kedlaya, San Jose, CA (US); Zubin Huang, Santa Clara, CA (US); Aykut Aydin, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 709 days.

(21) Appl. No.: 17/063,339

(22) Filed: Oct. 5, 2020

(65) Prior Publication Data

US 2022/0108892 A1    Apr. 7, 2022

(51) Int. Cl.
*H01L 21/033* (2006.01)
*C23C 16/38* (2006.01)

(52) U.S. Cl.
CPC .......... *H01L 21/0337* (2013.01); *C23C 16/38* (2013.01); *H01L 21/0332* (2013.01)

(58) Field of Classification Search
CPC ........ H01L 21/02532; H01L 21/02573; H01L 21/02579; H01L 21/02636; H01L 21/0262;
(Continued)

(56) References Cited

U.S. PATENT DOCUMENTS

2009/0087967 A1* 4/2009 Todd ................. H01L 21/02535
        252/79.1
2012/0083105 A1    4/2012 Pellegrin
(Continued)

FOREIGN PATENT DOCUMENTS

CN    101319309 A    12/2008
CN    111146348 A     5/2020
(Continued)

OTHER PUBLICATIONS

International Search Report and Written Opinion dated Jan. 26, 2022 in International Patent Application No. PCT/US2021/053289, 7 pages.
(Continued)

*Primary Examiner* — Brook Kebede
(74) *Attorney, Agent, or Firm* — Kilpatrick Townsend & Stockton LLP

(57) ABSTRACT

Embodiments of the present technology include semiconductor processing methods to make boron-and-silicon-containing layers that have a changing atomic ratio of boron-to-silicon. The methods may include flowing a silicon-containing precursor into a substrate processing region of a semiconductor processing chamber, and also flowing a boron-containing precursor and molecular hydrogen ($H_2$) into the substrate processing region of the semiconductor processing chamber. The boron-containing precursor and the $H_2$ may be flowed at a boron-to-hydrogen flow rate ratio. The flow rate of the boron-containing precursor and the $H_2$ may be increased while the boron-to-hydrogen flow rate ratio remains constant during the flow rate increase. The boron-and-silicon-containing layer may be deposited on a substrate, and may be characterized by a continuously increasing ratio of boron-to-silicon from a first surface in
(Continued)

contact with the substrate to a second surface of the boron-and-silicon-containing layer furthest from the substrate.

8 Claims, 4 Drawing Sheets

(58) Field of Classification Search
CPC .. H01L 21/0332; H01L 21/0337; C23C 16/38
See application file for complete search history.

(56) References Cited

U.S. PATENT DOCUMENTS

| | | |
|---|---|---|
| 2016/0358804 A1 | 12/2016 | Kulshreshtha et al. |
| 2017/0076942 A1* | 3/2017 | Curran ............... G02B 27/0916 |
| 2017/0287914 A1* | 10/2017 | Okada ..................... C23C 16/22 |
| 2018/0033622 A1 | 2/2018 | Swaminathan et al. |
| 2019/0006507 A1 | 1/2019 | Ma et al. |
| 2020/0144058 A1 | 5/2020 | Kohen |

FOREIGN PATENT DOCUMENTS

| | | |
|---|---|---|
| TW | 201704513 A | 2/2017 |
| WO | 2015048501 A2 | 4/2015 |

OTHER PUBLICATIONS

Application No. PCT/US2021/053289, International Preliminary Report on Patentability, dated Apr. 20, 2023, 6 pages.

\* cited by examiner

BORON CONCENTRATION TUNABILITY IN BORON-SILICON FILMS

TECHNICAL FIELD

The present technology relates to deposition and removal processes and chambers. More specifically, the present technology relates to systems and methods of tuning boron concentration in a boron-and-silicon-containing layer to make a film characterized by variable boron concentration along at least one direction.

BACKGROUND

Integrated circuits are made possible by processes which produce intricately patterned material layers on substrate surfaces. Producing patterned material on a substrate requires controlled methods for forming and removing material. Material characteristics may affect how the device operates, and may also affect how the films are removed relative to one another. Deposition processes produce films having certain characteristics. Many films that are formed require additional processing to adjust or enhance the material characteristics of the film in order to provide suitable properties.

Thus, there is a need for improved systems and methods that can be used to produce high quality devices and structures. These and other needs are addressed by the present technology.

SUMMARY

Embodiments of the present technology include semiconductor processing methods and systems that may tune the concentration of boron through a boron-and-silicon-containing layer. In embodiments, the methods may form a boron-and-silicon-containing layer with a highest atomic ratio of boron-to-silicon closest to an adjacent etch stop layer, and a lowest atomic ratio of boron-to-silicon furthest from the etch stop layer. In further embodiments, the boron-and-silicon-containing layer may have a continuously-changing gradient in the atomic ratio of boron-to-silicon from one end of the film to the other. In embodiments, the systems and methods of tuning the boron concentration in the boron-and-silicon-containing layer may produce hardmasks with high etch resistance at one end, and high etch selectivity compared to an etch stop layer at the other end. In further embodiments, high-aspect ratio openings may be formed in the hardmarks to define contacts, vias, and capacitor structures, among other substrate features, in semiconductor devices such as DRAM memory and 3D NAND memory, among other types of semiconductor devices.

Embodiments of the present technology include semiconductor processing method that may include flowing a silicon-containing precursor into a substrate processing region of a semiconductor processing chamber, and also flowing a boron-containing precursor and molecular hydrogen ($H_2$) into the substrate processing region of the semiconductor processing chamber. The boron-containing precursor and the $H_2$ may be flowed at a boron-to-hydrogen flow rate ratio. The method may further include increasing the flow rate of the boron-containing precursor and the $H_2$, while the boron-to-hydrogen flow rate ratio remains constant during the flow rate increase. The method may still further include depositing a boron-and-silicon-containing layer on a substrate in the substrate processing region of the semiconductor processing chamber. The deposited boron-and-silicon-containing layer may be characterized by a continuously increasing ratio of boron-to-silicon from a first surface in contact with the substrate to a second surface of the boron-and-silicon-containing layer furthest from the substrate.

In additional embodiments, the silicon-containing precursor may include silane $SiH_4$, and the boron-containing precursor may include diborane ($B_2H_6$). In still further embodiments, the silicon-containing precursor may flow into the substrate processing region at a silicon precursor flow rate greater than or about 40 sccm. In yet further embodiments, the boron-to-hydrogen flow rate ratio may be greater than or about 2:1. In some embodiments, the flow rate of the boron-containing-precursor and the $H_2$ may increase at a rate greater than or about 5 sccm/second. In additional embodiments, the deposition of the boron-and-silicon-containing layer may be characterized by a deposition rate greater than or about 10 Å/second. In still additional embodiments, the deposited boron-and-silicon-containing layer may be characterized by a first ratio of boron-to-silicon closest to the substrate that is less than or about 20 at. %, and a that may be further characterized by a second ratio of boron-to-silicon at a surface furthest from the substrate that is greater than or about 50 at. %.

Embodiments of the present technology may also include a semiconductor processing method that has a silicon containing precursor flowing into a substrate processing region of a semiconductor processing chamber. In some embodiments, the silicon-containing precursor may be silane. The method may also include flowing a boron-containing precursor into the substrate processing region of the semiconductor processing chamber. In some embodiments, the boron-containing precursor may be diborane. The method may further include depositing a boron-and-silicon-containing layer on a substrate in the substrate processing region of the semiconductor processing chamber. The boron-and-silicon-containing layer may have a linearly increasing ratio of boron-to-silicon from a first surface in contact with the substrate to a second surface of the boron-and-silicon-containing layer opposite the first surface, while the flow rate of the boron-containing precursor may increase non-linearly during the deposition of the boron-and-silicon-containing layer.

In additional embodiments, a rate of increase in the flow rate of the boron-containing precursor during the deposition of the boron-and-silicon-containing layer may be increased based on the increase in the ratio of boron-to-silicon being deposited. In still additional embodiments, the boron-and-silicon-containing layer may be characterized by a first ratio of boron-to-silicon at the first surface of the layer that is less than or about 20 at. %, and is further characterized by a second ratio of boron-to-silicon at the second surface opposite the first surface that is greater than or about 50 at. %. In further embodiments, the deposition of the boron-and-silicon-containing layer may be characterized by a deposition temperature that is greater than or about 300° C. In still further embodiments, the method may be characterized as a thermal deposition process, while in additional embodiments the method may be characterized as a plasma deposition process.

Embodiments of the present technology may further include semiconductor structures. The structure may include a boron-and-silicon-containing layer, and an etch stop layer. In embodiments, the boron-and-silicon-containing layer may be characterized by a continuously-changing boron-to-silicon ratio between a proximal portion of the layer that is in contact with the etch stop layer and a distal portion that is opposite the proximal portion. In embodiments, the proximal portion of the boron-and-silicon-containing layer may be characterized by a first ratio of boron-to-silicon that is less than or about 20 at. %, and the distal portion of the layer may be characterized by a second ratio of boron-to-silicon that is greater than or about 50 at. %.

In additional embodiments, the boron-and-silicon-containing layer may include boron-doped amorphous silicon. In still additional embodiments, the etch stop layer may include silicon oxide or silicon nitride. In yet further embodiments, an etch rate ratio between the proximal portion and distal portion of the boron-and-silicon-containing layer may be greater than or about 3:1. In still further embodiments, an etch selectivity ratio between the proximal portion of the boron-and-silicon-containing layer and the etch stop layer may be greater than or about 5:1. In additional embodiments, the etch selectivity ratio between the distal portion of the boron-and-silicon-containing layer and the etch stop layer may be less than or about 2:1.

Such technology may provide numerous benefits over conventional processing methods. For example, a continuously-changing, boron-and-silicon-containing layer may provide a layer with excellent hardmask qualities on one end, and excellent compatibility with an etch stop layer on an opposite end. These qualities of the continuously-changing, boron-and-silicon-containing layer make it better suited as a hardmask layer than a conventional boron-and-silicon-containing layer having a uniform ratio of boron-to-silicon throughout the layer. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
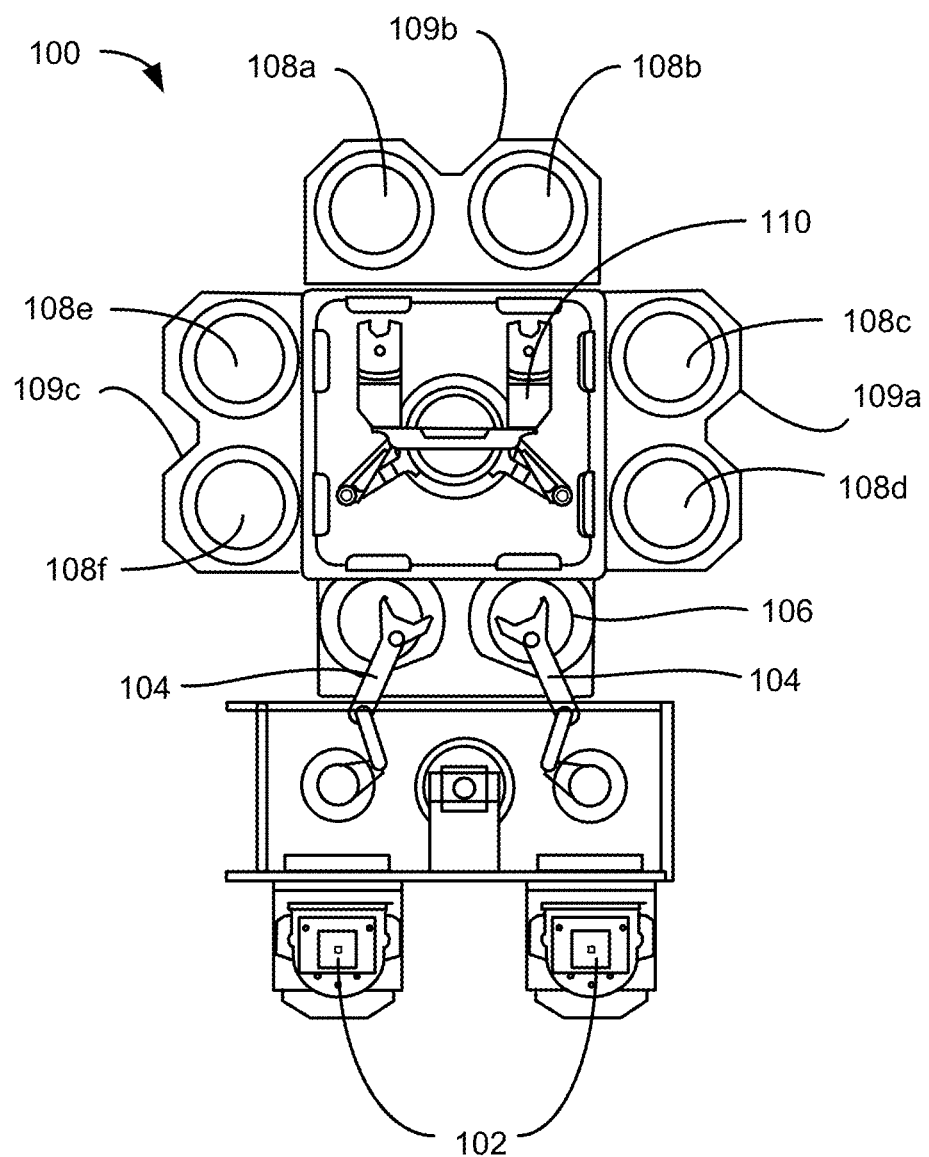
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Embodiments of the present technology include semiconductor processing methods and systems that may tune the concentration of boron through a boron-and-silicon-containing layer. Embodiments of these layers may be used as hardmasks for vertical openings in DRAM capacitor formation and contacts in 3D memory structures, among other types of semiconductor devices. As the depths and aspect ratios of the openings increase, the hardmask needs to become thicker or more etch resistant to form a smooth, straight opening down to an etch stop layer where the opening lands on a subsequent layer. Making the hardmask layer thicker requires more hardmask material and more time to make the hardmask, both of which increase semiconductor fabrication costs. Making the hardmask more etch resistant reduces the requirement to make the hardmask thicker, but can also make it more difficult to stop at a sharply defined endpoint for the opening.

Boron-and-silicon-containing layers illustrate both the benefits and challenges of making hardmasks from materials with increased etch resistance. The increased etch resistance of these layers allows thinner films to be deposited in shorter times to form a hardmask that can sharply define a long opening with a high aspect ratio. However, the low etch selectivity between the boron-and-silicon-containing layer and the adjacent etch stop layer makes it difficult to reach the endpoint of the opening without overetching into the etch stop layer. In many instances, the resulting opening has accurate, well-defined sidewalls and a poorly defined bottom. Forming a boron-and-silicon-containing layer with a reduced boron-to-silicon atomic ratio may increase the etch selectivity of the layer over an adjacent etch stop layer so that a more precise landing may be formed. However, the reduced boron-to-silicon ratio in the layer also lowers its etch resistance which may make a rougher, more bent channel during the hardmask opening. Conversely, a boron-and-silicon-containing layer with an increased boron-to-silicon atomic ratio may have a more precise hardmask opening, but a rougher less precise bottom side that may be caused by overetching into the etch stop layer.

The present technology addresses these issues with embodiments of process methods, systems, and structures, that include boron-and-silicon-containing layers characterized by different boron-to-silicon atomic ratios at opposite ends of the layer. In embodiments, the end of the boron-and-silicon-containing in contact with (i.e., proximal) an adjacent etch stop layer may have a lower boron-to-silicon atomic ratio than an opposite end of the layer furthest (i.e., distal) from the etch stop layer. The lower ratio at the proximal end of the layer creates an increased etch selectivity between the proximal end and the adjacent etch stop layer, which permits a precise bottom side to be formed in a hardmask opening operation. In addition, the higher boron-to-silicon ratio at the distal end of the layer creates an increased etch resistance in the distal end that permits a smoother, straighter, opening in the hardmask than would be possible with a less etch resistant hardmask material.

The present technology includes embodiments of semiconductor processing methods that continuously increase a flow rate of a boron-containing precursor relative to a silicon-containing precursor as a deposition of a boron-and-silicon-containing layer progresses. In embodiments, the method produces a boron-and-silicon-containing layer having a continuously increasing boron-to-silicon atomic ratio between a proximal end closest to an etch stop layer, and an opposite distal end furthest from the etch stop layer. In some embodiments, the proximal end of the boron-and-silicon-containing layer may be characterized by less than or about 20 at. % boron and the distal end of the layer may be characterized by more than or about 50 at. % boron.

The present technology further includes embodiments of semiconductor processing methods that form a boron-and-silicon-containing layer with a linearly-changing atomic ratio of boron-to-silicon between opposite ends of the layer. In embodiments, these layers may include a linearly increasing atomic ratio of boron-to-silicon between a proximal end of the layer closest to an etch stop layer and an opposite distal end furthest from the etch stop layer. In further embodiments, a boron-and-silicon-containing layer characterized by a linearly-changing atomic ratio of boron-to-silicon may be characterized by a linearly-proportional change in the ratio as a function of a distance from a proximal end of the layer that is closest to an adjacent etch stop layer. It is to be understood that the gradient may not be linear in some embodiments where a flow rate may be increased more quickly, to produce a more logarithmic or other gradient within the film.

In further embodiments, the linearly-changing atomic ratio of boron-to-silicon in a boron-and-silicon-containing layer may be formed in a deposition operation where a boron-containing precursor flows at a non-linear rate to the deposition chamber as the layer is formed. In embodiments, the non-linear flow rate of the boron-containing precursor may compensate for an increased absorption rate of boron in the depositing layer as the atomic ratio of boron-to-silicon increases. The influence of the deposited boron level on the rate of boron incorporation into the depositing layer means that a linear increase in a flow rate of a boron-containing precursor will result in a greater than linear increase in the boron level of the depositing layer. In some embodiments, a linearly-increasing flow rate of a boron-containing precursor may result in an logarithmically-increasing boron-to-silicon atomic ratio in the deposited layer. In additional embodiments, this influence may be countered by reducing the increase in the flow rate of the boron-containing precursor to deposit a linearly-increasing level of boron in the deposited layer.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may be used to perform deposition processes according to embodiments of the present technology before additional details according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108*a-f* may include one or more system components for depositing, annealing, curing and/or etching a hardmask layer on the substrate. In one configuration, two pairs of the processing chambers, e.g., 108*c-d* and 108*e-f*, may be used to deposit a hardmask layer on the substrate, and the third pair of processing chambers, e.g., 108*a-b*, may be used to etch the deposited hardmask (i.e., a hardmask opening operation). In another configuration, all three pairs of chambers, e.g., 108*a-f*, may be configured to deposit and etch hardmask layers on the substrate. Any one or more of the processes described may be carried out in chambers separated from the fabrication system shown in different embodiments. It will be appreciated that additional configurations of deposition, etching, annealing, and curing chambers for hardmask layers are contemplated by system 100.

Figure 2:
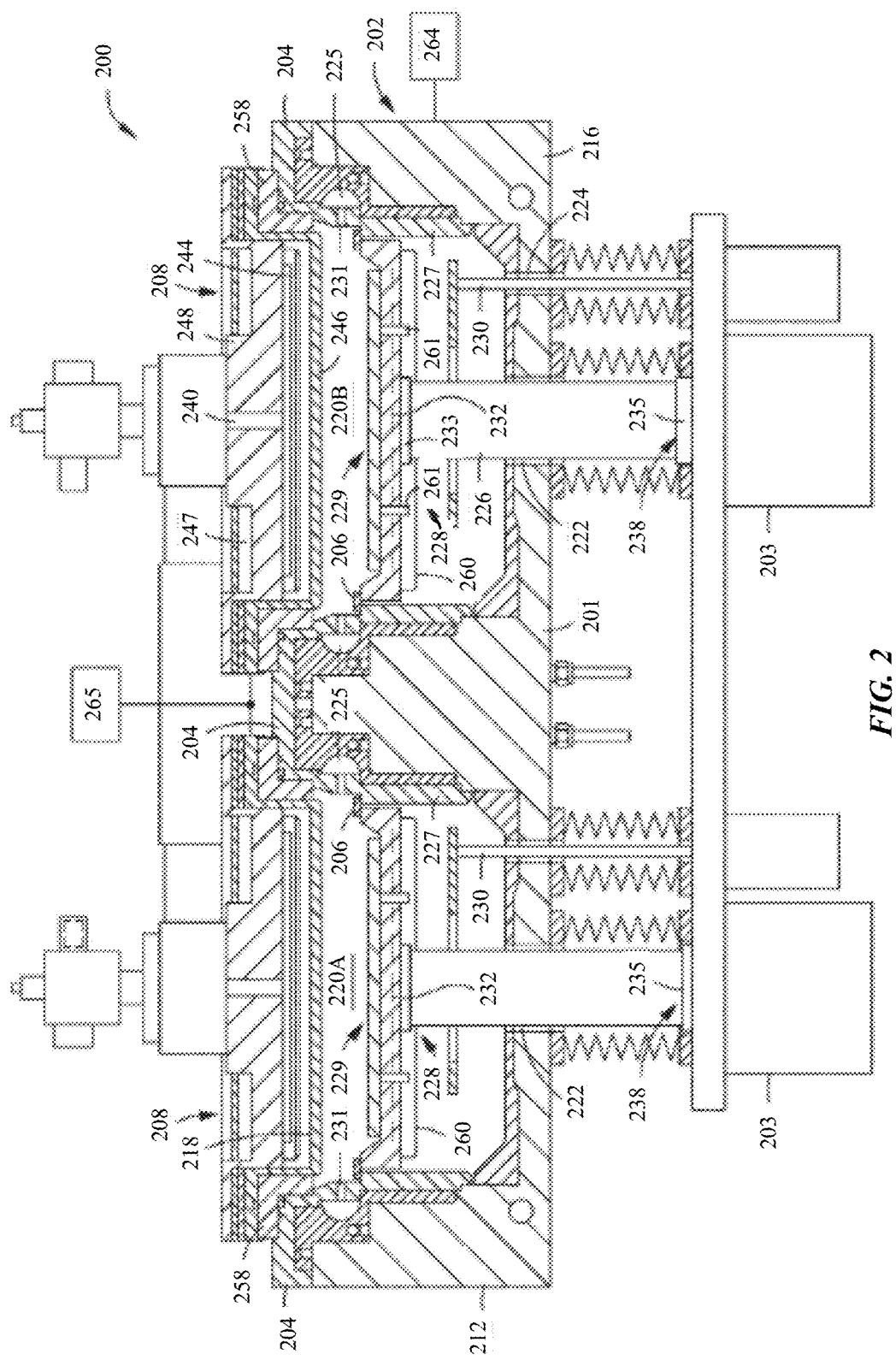
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include lid stack components according to embodiments of the present technology, and as may be explained further below. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. The dual-channel showerhead 218 and/or faceplate 246 may include one or more openings to permit the flow of precursors from the precursor distribution system 208 to the processing regions 220A and/or 220B. In some embodiments, the openings may include at least one of straight-shaped openings and conical-shaped openings. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the precursor distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
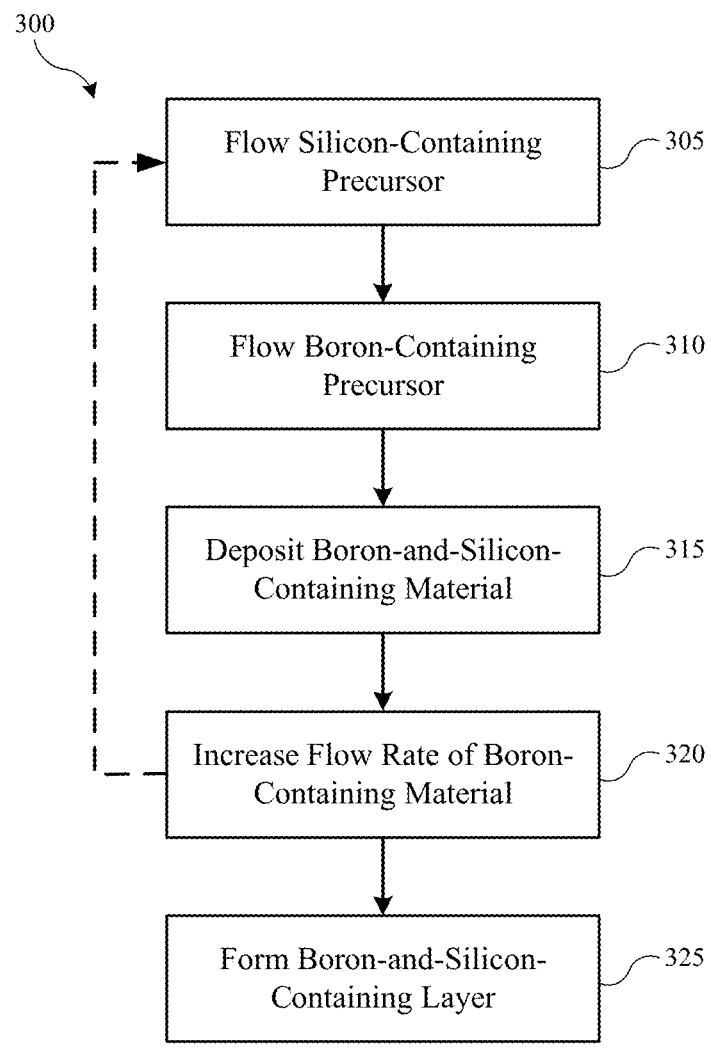
FIG. 3 shows operations of an exemplary method of semiconductor processing according to some embodiments of the present technology.

FIG. 3 shows operations of an exemplary method 300 of semiconductor processing according to some embodiments of the present technology. The method may be performed in a variety of processing chambers, including processing system 200 described above, as well as any other chamber in which plasma deposition may be performed. Method 300 may include a number of optional operations, which may or may not be specifically associated with some embodiments of methods according to the present technology.

Method 300 may include deposition processing operations to form a boron-and-silicon-containing layer with a varying atomic ratio of boron-to-silicon. In some embodiments, the deposition processing operations may include plasma-enhanced chemical vapor deposition operations, while in additional embodiments the deposition processing operations may include thermal deposition operations. In embodiments, the method may include optional operations prior to initiation of method 300, or the method may include additional operations after the deposition of the boron-and-silicon-containing material. For example, in embodiments an etch stop layer may be formed prior to the initiation of method 300 to form the boron-and-silicon-containing layer. In additional embodiments, as surface of the etch stop layer may be prepared for the deposition of the boron-and-silicon-containing layer by being treated with a plasma generated from argon and ammonia. In additional embodiments, a hardmask opening operation may be performed to form an opening in the boron-and-silicon-containing layer after it has been formed in method 300.

In embodiments of method 300, as shown in FIG. 3, a silicon-containing precursor may flow into a substrate processing region of a semiconductor processing chamber at operation 305. In additional embodiments, a substrate may be present in the substrate processing region of the semiconductor processing chamber as the deposition precursors flow into the chamber. In still additional embodiments, the substrate may include an etch stop layer exposed to the substrate processing region of the semiconductor processing chamber.

In some embodiments, the silicon-containing precursor may be a silicon-and-hydrogen-containing precursor such as silane ($SiH_4$) and disilane ($Si_2H_6$). In additional embodiments, the silicon-containing-precursor may be free of carbon. In still additional embodiments, the silicon-containing precursor may be free of oxygen. In embodiments, a flow rate for the silicon-containing precursor may be greater than or about 25 sccm, greater than or about 30 sccm, greater than or about 35 sccm, greater than or about 40 sccm, greater than or about 45 sccm, greater than or about 50 sccm, greater than or about 60 sccm, greater than or about 70 sccm, greater than or about 80 sccm, greater than or about 90 sccm, greater than or about 100 sccm, or more.

In additional embodiments, a carrier gas may be combined with the silicon-containing precursor flowing into the substrate processing region of the substrate processing chamber. In embodiments, the carrier gas may be one or more of helium, argon, and molecular nitrogen ($N_2$), among other carrier gases. In embodiments, a flow rate for the carrier gas may be greater than or about 3000 sccm, greater than or about 4000 sccm, greater than or about 5000 sccm, greater than or about 6000 sccm, greater than or about 7000 sccm, or more. For some embodiments, increasing carrier gas flow rate may benefit the mechanical properties of the film. Having carrier gas can also make it easier to strike a plasma.

Embodiments of method 300 may further include flowing a boron-containing precursor and molecular hydrogen ($H_2$) into the substrate processing region of the semiconductor processing chamber at operation 310. In further embodiments, the boron-containing precursor may include diborane ($B_2H_6$). In still further embodiments, the boron-containing precursor may include borane ($BH_3$). In embodiments, the flow rate of the boron-containing precursor may be greater than or about 500 sccm, greater than or about 750 sccm, greater than or about 1000 sccm, greater than or about 1250 sccm, greater than or about 1500 sccm, greater than or about 1750 sccm, greater than or about 2000 sccm, or more. In further embodiments, the flow rate of the $H_2$ may be greater than or about 1000 sccm, greater than or about 1500 sccm, greater than or about 2000 sccm, greater than or about 2500 sccm, greater than or about 3000 sccm, greater than or about 3500 sccm, greater than or about 4000 sccm, greater than or about 4500 sccm, greater than or about 5000 sccm, or more.

In embodiments of the technology, the silicon-containing precursor and boron-containing precursor that flow into the semiconductor processing region deposit boron-and-siliconcontaining material on the substrate at operation 315. In some embodiments, formation operations include the generation of a plasma to produce boron-and-silicon-containing plasma effluents that form the boron-and-silicon material on the substrate. In additional embodiments, formation operations include heating the substrate in the absence of a plasma to thermally deposit the boron-and-silicon layer on the substrate. In these embodiments, the deposition operations change an atomic ratio of boron-to-silicon in the deposition precursors during the deposition such that a first surface of the boron-and-silicon-containing layer in contact with the substrate has a different atomic ratio of boron-to-silicon than a second surface of the layer that is opposite the first surface.

In some embodiments of method 300, the change in the ratio of boron-to-silicon between the opposite surfaces of the boron-and-silicon-containing layer may be realized by increasing the flow rate of the boron-containing precursor and $H_2$ at operation 320. In embodiments, the flow rate ratio of the boron-containing precursor and $H_2$ may be increased at a rate of greater than or about 5 sccm/second, greater than or about 6 sccm/second, greater than or about 7 sccm/second, greater than or about 8 sccm/second, greater than or about 9 sccm/second, greater than or about 10 sccm/second, greater than or about 15 sccm/second, greater than or about 20 sccm/second, greater than or about 25 sccm/second, or more. In additional embodiments, the flow rate ratio between the boron-containing precursor and the $H_2$ may remain constant during the increase in their combined flow rate. In embodiments, a flow rate ratio of the boron-containing precursor to the $H_2$ may be greater than or about 2:1, greater than or about 3:1, greater than or about 4:1, greater than or about 5:1, or more.

In further embodiments, the flow rate of the boron-containing precursor and $H_2$ may increase in a non-linear progression from a lowest to highest flow rate during the deposition of the boron-and-silicon-containing layer. In embodiments, the non-linear increase in the flow rate may form a boron-and-silicon-containing layer characterized by a linearly changing atomic percentage of boron between a first surface of the layer contacting the substrate and a second surface opposite the first surface. The non-linear increase in flow rate may produce a linear change in the boron-to-silicon atomic ratio because of the effect that the atomic percentage of boron in the depositing material has on the incorporation of more boron into the material. In some instances, the boron-containing precursor may have a catalytic effect on the deposition rate of the boron-and-silicon-containing layer with a linear increase in the flow rate producing a greater than linear increase in the deposition rate. In additional instances, the increased deposition rate may make it more difficult for boron to be incorporated into the boron-and-silicon-containing layer. Thus, while the deposition rate is increasing disproportionally faster than the flow rate of the boron-containing precursor, the percentage of boron in the depositing material may be increasing disproportionally slower than the flow rate of the boron-containing material. Consequently, a linearly-increasing flow rate for the boron-containing precursor may produce a deposited boron-and-silicon-containing material with a less than linear increase in the atomic percentage of boron. In some embodiments, this effect of boron atomic percentage on the boron incorporation rate may be countered by a non-linear increase in the flow rate of the boron-containing precursor during the deposition operation. In embodiments, the flow rate of the boron-containing precursor and $H_2$ may be characterized by a non-linear increase that is greater than a linear increase to form a boron-and-silicon-containing layer characterized by a linearly increasing atomic percentage of boron in the layer.

In still further embodiments, the change in the flow rate of the boron-containing precursor and the $H_2$ may be continuous, while in additional embodiments the change may be non-continuous. In embodiments where the change in flow rate is non-continuous, the boron-and-silicon-containing layer may be characterized by two or more portions that have a uniform boron-to-silicon ratio within each portion. In additional embodiments, a first portion that includes a first surface contacting the substrate may be characterized by the lowest atomic ratio of boron-to-silicon of any portion in the boron-and-silicon-containing layer. In still additional embodiments, a final portion of the layer that includes a second surface opposite the first surface may be characterized by the highest atomic ratio of boron-to-silicon of any portion in the layer. In embodiments, the boron-and-silicon-containing layer may have greater than or about two portions, greater than or about three portions, greater than or about five portions, greater than or about ten portions, greater than or about 15 portions, greater than or about 20 portions, or more.

In additional embodiments, the flow rate increase in the boron-containing precursor and $H_2$ may occur while the flow rate of the silicon-containing precursor is held constant or decreased. In some of these embodiments, a deposition rate of the boron-and-silicon-containing material may be held constant by balancing an increase in the flow rate of the boron-containing precursor and $H_2$ with a decrease in the flow rate of the silicon-containing precursor. In still additional embodiments, the flow rate of the silicon-containing precursor may be increased at a slower rate than the flow rate increase of the boron-containing precursor and $H_2$, which results in an overall increase in the ratio of boron-to-silicon in the deposition precursors that deposit the boron-and-silicon-containing material. In some of these embodiments, the deposition rate of the boron-and-silicon-containing material increases as the deposition progresses. In embodiments, a deposition rate for the boron-and-silicon-containing material may be greater than or about 5 Å/second, greater than or about 7.5 Å/second, greater than or about 10 Å/second, greater than or about 12.5 Å/second, greater than or about 15 Å/second, greater than or about 17.5 Å/second, greater than or about 20 Å/second, greater than or about 22.5 Å/second, greater than or about 25 Å/second, or more.

In embodiments, the deposition precursors that flow into the substrate processing region of the semiconductor processing chamber may include one or more silicon-containing precursors, one or more boron-containing precursors, molecular hydrogen ($H_2$), and one or more carrier gases, among other deposition precursors. These deposition precursors may alter the pressure of the semiconductor processing chamber during the deposition of the boron-and-silicon-containing material. In embodiments, the semiconductor substrate chamber pressure may be characterized by a pressure greater than or about 1 Torr, greater than or about 2 Torr, greater than or about 3 Torr, greater than or about 4 Torr, greater than or about 5 Torr, greater than or about 6 Torr, greater than or about 7 Torr, greater than or about 8 Torr, greater than or about 9 Torr, greater than or about 10 Torr, or more during the formation of a low-K film.

In embodiments of the present technology, the deposition of the boron-and-silicon-containing material on the substrate may include plasma deposition operations, while in additional embodiments, the deposition may include thermal deposition operations. In embodiments of plasma deposition operations, the substrate may be characterized by a temperature greater than or about 300° C., greater than or about 310° C., greater than or about 320° C., greater than or about 330° C., greater than or about 340° C., greater than or about 350° C., greater than or about 360° C., greater than or about 370° C., greater than or about 380° C., greater than or about 390° C., greater than or about 400° C., or more during the plasma deposition. In embodiments of the thermal deposition operations, the substrate may be characterized by a temperature greater than or about 400° C., greater than or about 410° C., greater than or about 420° C., greater than or about 430° C., greater than or about 440° C., greater than or about 450° C., greater than or about 460° C., greater than or about 470° C., greater than or about 480° C., greater than or about 490° C., greater than or about 500° C., or more during the thermal deposition. A higher deposition temperature may reduce H % content of the film, which may enhance its mechanical properties while making it less transparent. The rate at which $B_2H_6$ catalyzes the B Si film deposition and the amount of B % that gets incorporated can also depend on temperature.

In embodiments of the plasma deposition operations, the operations may further include generating a deposition plasma from the deposition precursors that flow into the substrate processing region of semiconductor processing chamber. In embodiments, the deposition plasma may be generated from the deposition precursors within the processing region, such as by providing RF power to the faceplate to generate a plasma within the substrate processing region of the semiconductor processing chamber. The deposition plasma may be generated at any of the frequencies previously described, and may be generated at a frequency less than 15 MHz (e.g., 13.56 MHz).

In embodiments of the deposition of the boron-and-silicon-containing material may continue until an endpoint thickness for the layer is reached and the layer is fully formed at operation 325. In some embodiments, this endpoint thickness may be greater than or about 100 Å, greater than or about 500 Å, greater than or about 1000 Å, greater than or about 1500 Å, greater than or about 2000 Å, greater than or about 2500 Å, greater than or about 3000 Å, greater than or about 3500 Å, greater than or about 4000 Å, greater than or about 4500 Å, greater than or about 5000 Å, or more.

Figure 4:
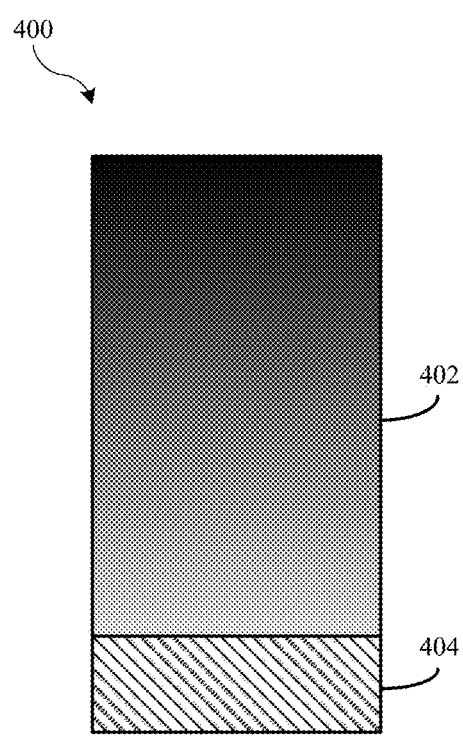
FIG. 4 shows a cross-sectional view of a semiconductor structure according to some embodiments of the present technology.

In embodiments of the present technology, the method 300 forms a boron-and-silicon-containing layer with a varying atomic ratio of boron-to-silicon between a first surface in contact with the substrate and a second surface opposite the first. FIG. 4 shows an embodiment of a semiconductor structure 400 that includes such a boron-and-silicon-containing layer 402 formed on an etch stop layer 404. In the embodiment shown in structure 400, the boron-and-silicon-containing layer has a linearly increasing atomic ratio of boron-to-silicon between a first surface in contact with the etch stop layer 404 and a second surface opposite the first surface. In embodiments, the first surface proximal to the etch stop layer may have a boron concentration less than or about 20 at. %, less than or about 15 at. %, less than or about 12.5 at. %, less than or about 10 at. %, less than or about 9 at. %, less than or about 8 at. %, less than or about 7 at. %, less than or about 6 at. %, less than or about 5 at. %, less than or about 4 at. %, less than or about 3 at. %, less than or about 2 at. %, or less. In further embodiments, the first surface may have a silicon concentration greater than or about 90 at. %. In still further embodiments, the second surface of the boron-and-silicon-containing layer that is opposite the first and most distal to the etch stop layer may have a boron concentration greater than or about 50 at. %, greater than or about 60 at. %, greater than or about 70 at. %, greater than or about 80 at. %, greater than or about 85 at. %, greater than or about 90 at. %, greater than or about 95 at. %, or more. Conversely, embodiments of the second surface may have a silicon concentration that is less than or about 50 at. %. In additional embodiments, the difference in the atomic percentage of boron between the first surface of the boron-and-silicon-containing layer in contact with the etch stop layer 404 and the second surface that is opposite the first surface may be greater than or about 10%, greater than or about 20%, greater than or about 30%, greater than or about 40%, greater than or about 50%, greater than or about 60%, greater than or about 70%, greater than or about 80%, greater than or about 90%, or more.

In embodiments, the atomic ratio of boron-to-silicon may be continuously changing between the first and second surfaces of the boron-and-silicon-containing layer 402. In additional embodiments, the atomic ratio of boron-to-silicon may linearly increase starting from the first surface in contact with the etch stop layer 404 and ending with the second surface opposite the first surface. In still further embodiments, a change in the atomic percentage of boron in the boron-and-silicon-containing layer 402 may be represented by the formula:

$$\text{Boron at. \%} = (cx^a + x_0) \times 100$$

where "Boron at. %" represents the atomic percentage of boron at a particular location in the boron-and-silicon-containing layer 402, "$x_0$" represents the atomic fraction of boron at the first surface (i.e., x=0), "x" represents a distance from the first surface in contact with the etch stop layer 404, and c represents the rate of change in the atomic fraction of boron per unit of distance. In some embodiments, "x" may be a normalized distance having a value of zero at the first surface of the boron-and-silicon-containing layer 402 in contact with the etch stop layer 404, and having a value of one at the second surface opposite the first surface. In additional embodiments, "c" may be greater than or about 0.02, greater than or about 0.05, greater than or about 0.1, greater than or about 0.15, greater than or about 0.2, greater than or about 0.25, greater than or about 0.3, greater than or about 0.35, greater than or about 0.4, greater than or about 0.45, greater than or about 0.5, greater than or about 0.55, greater than or about 0.6, greater than or about 0.65, greater than or about 0.7, greater than or about 0.75, greater than or about 0.8, or more. In embodiments where the atomic ratio of boron-to-silicon is linearly increasing, "a" may be equal to one. In additional embodiments where the atomic ratio of boron-to-silicon is increasing at greater than a linear rate, "a" may be greater than one.

In additional embodiments, the atomic ratio of boron-to-silicon may change in a non-continuous manner. In embodiments, the atomic ratio of boron-to-silicon may change in a stepwise manner where a portion of the boron-and-silicon-containing layer 402 has a uniform atomic ratio of boron-to-silicon that is different from the atomic ratios of other portions of the layer. In additional embodiments, the boron-and-silicon-containing layer 402 may have a first portion that includes a first surface in contact with the etch stop layer 404 that his the lowest atomic ratio of boron-to-silicon of any portion of the boron-and-silicon-containing layer 402. In further embodiments the same the boron-and-silicon-containing layer 402 may have another portion, which includes a second surface opposite the first surface, that may have the lowest atomic ratio of boron-to-silicon of any portion of the layer. In still additional embodiments, the boron-and-silicon-containing layer 402 may have a number of additional portions between the first portion and the another portion that may be greater than or about 1, greater than or about 2, greater than or about 5, greater than or about 10, greater than or about 15, greater than or about 20, or more. In still further embodiments, each of the additional portions may be characterized by a uniform atomic ratio of boron-to-silicon. In yet further embodiments, the each of the additional portions may be characterized by an increasing atomic ratio of boron-to-silicon starting from the first portion and progressing to the portion that includes the second surface opposite the first surface that contacts the etch stop layer 404.

In still additional embodiments, the boron-and-silicon-containing layer may have one or more portions with a changing boron concentration and one or more additional portions where the boron concentration is uniform throughout the portion. In embodiments, the boron-and-silicon-containing layer may include a first portion closest to an etch stop layer that has a lowest atomic ratio of boron-to-silicon starting from a first surface in contact with an etch stop layer and increasing to a highest atomic ratio of boron-to-silicon at a second surface opposite the first surface. The boron-and-silicon-containing layer may include a second portion having a surface in contact with the second surface for the first portion of the layer that is characterized by a uniform atomic ratio of boron-to-silicon throughout the second portion. In some embodiments, the atomic ratio of boron-to-silicon may be greater than or about the atomic ratio at the second surface of the first portion of the boron-and-silicon-containing layer. In still further embodiments, the boron-and-silicon-containing layer may include at least a third portion have a surface in contact with the second portion of the layer, where the third portion has a uniform atomic ratio of boron-to-silicon that is different than the ratio in the second portion. In still further embodiments, the atomic ratio of boron-to-silicon in the third portion may be greater than the atomic ratio of boron-to-silicon in the second portion.

In embodiments, the boron-and-silicon-containing layer 402 may be characterized by less than 0.01 at. % of one or more of hydrogen, oxygen, and carbon. In some embodiments, the boron-and-silicon-containing layer 402 may be characterized as a boron-doped, amorphous silicon layer. In additional embodiments, the boron-and-silicon-containing layer 402 may be characterized as a silicon-doped boron-containing layer. In still additional embodiments, the boron-and-silicon-containing layer 402 may be characterized as both types of layers depending on what part of the layer is being characterized.

In the embodiment shown, the boron-and-silicon-containing layer 402 is adjacent to an etch stop layer 404. In embodiments, the etch stop layer 404 may be a silicon oxide layer or a silicon nitride layer. In further embodiments, the etch stop layer may be more etch resistant to one or more types of etchants than the material of the boron-and-silicon-containing layer 402 proximal to the etch stop layer. In embodiments, the etchants or etch operation may have an etch selectivity for the proximal material in the boron-and-silicon layer compared to the etch stop material that is greater than or about 2:1, greater than or about 3:1, greater than or about 4:1, greater than or about 5:1, or more. An increased etch selectivity reduces or eliminates overetching at the proximal interface of the boron-and-silicon-containing layer 402 and the etch stop layer 404. The more precisely etched interface may produce a more sharply defined bottom side of an opening (not shown) formed in the boron-and-silicon-containing layer 402.

In additional embodiments, the second surface of the boron-and-silicon-containing layer 402 that is opposite the first surface in contact with the etch stop layer 404 may have a lower etch rate (i.e., higher etch resistance) than the first surface due to having higher boron levels. In embodiments, the etch rate ratio between the first surface in contact with the etch stop layer 404 and the second surface that is opposite the first may be greater than or about 2:1, greater than or about 3:1, greater than or about 4:1, greater than or about 5:1, greater than or about 10:1, greater than or about 20:1, greater than or about 50:1, greater than or about 100:1, or more. The increased etch resistance near the second surface of the boron-and-silicon-containing layer 402 permits more precise control of an etch operation that may be used to form a hardmask opening in the layer. The increased etch resistance reduces the drift and variability in the formation of the opening, which provides a straighter and smoother opening along the length of the boron-and-silicon-containing layer 402.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a material" includes a plurality of such materials, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
flowing a silicon-containing precursor into a substrate processing region of a semiconductor processing chamber;

flowing a boron-containing precursor and molecular hydrogen (H$_2$) into the substrate processing region of the semiconductor processing chamber, at a boron-to-hydrogen flow rate ratio;

increasing the flow rate of the boron-containing precursor and the H$_2$, wherein the boron-to-hydrogen flow rate ratio remains constant during the flow rate increase;

depositing a boron-and-silicon-containing layer on a substrate in the substrate processing region of the semiconductor processing chamber, wherein the boron-and-silicon-containing layer as a continuously increasing ratio of boron-to-silicon from a first surface in contact with the substrate to a second surface of the boron-and-silicon-containing layer furthest from the substrate.

2. The semiconductor processing method of claim 1, wherein the silicon-containing precursor comprises silane (SiH$_4$).

3. The semiconductor processing method of claim 1, wherein the silicon-containing precursor flows into the substrate processing region at a silicon flow rate greater than or about 40 sccm.

4. The semiconductor processing method of claim 1, wherein the boron-containing precursor comprises diborane (B$_2$H$_6$).

5. The semiconductor processing method of claim 4, wherein the boron-to-hydrogen flow rate ratio is greater than or about 2:1.

6. The semiconductor processing method of claim 1, wherein the flow rate increase of the boron-containing precursor and the H$_2$ is greater than or about 5 sccm/second.

7. The semiconductor processing method of claim 1, wherein the deposition of the boron-and-silicon-containing layer is characterized by a deposition rate greater than or about 10 Å/second.

8. The semiconductor processing method of claim 1, wherein the boron-and-silicon-containing layer is characterized by a first ratio of boron-to-silicon closest to the substrate that is less than or about 20 at. %, and is further characterized by a second ratio of boron-to-silicon at the surface furthest from the substrate that is greater than or about 50 at. %.

* * * * *